(12) United States Patent
Rasmussen

(10) Patent No.: US 10,856,416 B2
(45) Date of Patent: Dec. 1, 2020

(54) FLEXIBLE PRINTED CIRCUIT ELECTRICAL CONNECTOR

(71) Applicant: ATL Technology, LLC, Springville, UT (US)

(72) Inventor: Kelly Rasmussen, Salem, UT (US)

(73) Assignee: ATL TECHNOLOGY, LLC, Springville, UT (US)

( * ) Notice: Subject to any disclaimer, the term of this patent is extended or adjusted under 35 U.S.C. 154(b) by 0 days.

(21) Appl. No.: 16/790,691

(22) Filed: Feb. 13, 2020

(65) Prior Publication Data

US 2020/0260582 A1 Aug. 13, 2020

Related U.S. Application Data

(60) Provisional application No. 62/805,066, filed on Feb. 13, 2019.

(51) Int. Cl.
| | |
|---|---|
| *H05K 1/02* | (2006.01) |
| *H05K 1/11* | (2006.01) |
| *H01R 12/63* | (2011.01) |
| *H01R 12/59* | (2011.01) |
| *H05K 3/32* | (2006.01) |

(52) U.S. Cl.
CPC ........... *H05K 1/118* (2013.01); *H01R 12/592* (2013.01); *H01R 12/63* (2013.01); *H05K 1/0281* (2013.01); *H05K 3/326* (2013.01)

(58) Field of Classification Search
CPC .............. H05K 1/0281; H05K 1/148; H05K 2201/2027
See application file for complete search history.

(56) References Cited

U.S. PATENT DOCUMENTS

| | | | |
|---|---|---|---|
| 2,396,725 A | 3/1946 | Thomas Jr. | |
| 3,718,859 A | 2/1973 | Arlow | |
| 4,917,613 A | * 4/1990 | Kabadi | ................. H01R 12/62 439/457 |
| 5,632,655 A | 5/1997 | Demarco, Jr. | |
| 2015/0157862 A1 | * 6/2015 | Greenberg | ........... H05K 3/4061 607/60 |

FOREIGN PATENT DOCUMENTS

GB        1239070        7/1971

\* cited by examiner

*Primary Examiner* — Jeremy C Norris
(74) *Attorney, Agent, or Firm* — Kunzler Bean & Adamson

(57) ABSTRACT

Disclosed herein is an electrical connector. The electrical connector comprises a flexible printed circuit comprising electrical elements on a flexible substrate. The electrical elements each comprises a solder pad and contact pad connected by a link. The electrical connector also comprises a base to at least partially surround the flexible printed circuit. The base comprises a connection interface to facilitate electrical connection with the flexible printed circuit through the base. The electrical connector further comprises a receptacle to couple to the base to partially enclose the flexible printed circuit. The receptacle exposes a portion of the flexible printed circuit to facilitate selective electrical connection with the flexible printed circuit through the receptacle.

20 Claims, 7 Drawing Sheets

FLEXIBLE PRINTED CIRCUIT ELECTRICAL CONNECTOR

CROSS-REFERENCE TO RELATED APPLICATION

This application claims the benefit of U.S. Provisional Patent Application No. 62/805,066, filed Feb. 13, 2019, which is incorporated herein by reference.

FIELD

This disclosure relates generally to electrical connectors, and more particularly to high-density electrical connectors and associated electrical connector systems that employ a flexible printed circuit.

BACKGROUND

High-density electrical connectors are used to establish multiple electrical connections with a single connector. However, the design and manufacturing of such high-density electrical connectors can be difficult and expensive. Conventionally, individually machined or stamped electrical contacts must be precisely sized, spaced, and located due to tolerance stacking of multiple mating parts. Such precision often requires expensive equipment, materials, and assembly techniques.

SUMMARY

The subject matter of the present application has been developed in response to the present state of the art, and in particular, in response to the problems and needs of conventional devices or products for providing a high-density electrical connection between systems that have not yet been fully solved. The subject matter of the present application has been developed to provide an electrical connector that facilitates a high-density electrical connection that overcomes many of the shortcomings of the prior art.

Disclosed herein is an electrical connector. The electrical connector comprises a flexible printed circuit comprising electrical elements on a flexible substrate. The electrical elements each comprises a solder pad and contact pad connected by a link. The electrical connector also comprises a base to at least partially surround the flexible printed circuit. The base comprises a connection interface to facilitate electrical connection with the flexible printed circuit through the base. The electrical connector further comprises a receptacle to couple to the base to partially enclose the flexible printed circuit. The receptacle exposes a portion of the flexible printed circuit to facilitate selective electrical connection with the flexible printed circuit through the receptacle. The preceding subject matter of this paragraph characterizes example 1 of the present disclosure.

The flexible printed circuit forms an annulus. The preceding subject matter of this paragraph characterizes example 2 of the present disclosure, wherein example 2 also includes the subject matter according to example 1, above.

The flexible substrate of the flexible printed circuit comprises a radially outer peripheral surface and a radially inner peripheral surface. The radially inner peripheral surface is opposite the radially outer peripheral surface. The electrical elements are on the radially outer peripheral surface of the flexible substrate. The preceding subject matter of this paragraph characterizes example 3 of the present disclosure, wherein example 3 also includes the subject matter according to example 2, above.

The base has a circular shape. The receptacle has a circular shape. The base and the receptacle are coaxial with the flexible printed circuit. The preceding subject matter of this paragraph characterizes example 4 of the present disclosure, wherein example 4 also includes the subject matter according to any one of examples 2-3, above.

The receptacle comprises a circular protrusion coaxial with the base, the receptacle, and the flexible printed circuit. The flexible printed circuit is supported on the circular protrusion. The preceding subject matter of this paragraph characterizes example 5 of the present disclosure, wherein example 5 also includes the subject matter according to any one of examples 2-4, above.

The base forms an annulus. The circular protrusion of the receptacle extends at least partially through the base. The preceding subject matter of this paragraph characterizes example 6 of the present disclosure, wherein example 6 also includes the subject matter according to example 5, above.

A radially inner edge of the base comprises a plurality of recesses. The flexible printed circuit supported on the circular protrusion circumferentially encloses the plurality of recesses to form a plurality of apertures. Each one of the electrical elements is at least partially positioned within a corresponding one of the plurality of apertures. The preceding subject matter of this paragraph characterizes example 7 of the present disclosure, wherein example 7 also includes the subject matter according to example 6, above.

The electrical connector further comprises at least one pin contact in the receptacle. The at least one pin contact is positioned radially inwardly of the flexible printed circuit and extends at least partially through the flexible printed circuit. The preceding subject matter of this paragraph characterizes example 8 of the present disclosure, wherein example 8 also includes the subject matter according to any one of examples 2-7, above.

The flexible substrate comprises a surface extending between a first edge and a second edge of the flexible substrate. The solder pad is positioned on the surface along the first edge. The contact pad is positioned on the surface along the second edge. The link is positioned on the surface and extends between the solder pad and the contact pad. The preceding subject matter of this paragraph characterizes example 9 of the present disclosure, wherein example 9 also includes the subject matter according to any one of examples 1-8, above.

The flexible substrate comprises a first surface and a second surface, the second surface being opposite the first surface. A first set of the electrical elements are on the first surface of the flexible substrate. A second set of the electrical elements are on the second surface of the flexible substrate. The preceding subject matter of this paragraph characterizes example 10 of the present disclosure, wherein example 10 also includes the subject matter according to any one of examples 1-9, above.

The flexible printed circuit forms a spiral. The preceding subject matter of this paragraph characterizes example 11 of the present disclosure, wherein example 11 also includes the subject matter according to any one of examples 1-10, above.

The flexible printed circuit comprises multiple spaced apart and concentric layers. The preceding subject matter of this paragraph characterizes example 12 of the present disclosure, wherein example 12 also includes the subject matter according to any one of examples 1-11, above.

The flexible printed circuit comprises multiple spaced apart and overlapping layers. The preceding subject matter of this paragraph characterizes example 13 of the present disclosure, wherein example 13 also includes the subject matter according to any one of examples 1-12, above.

Further disclosed herein is an electrical connector system. The electrical connector system comprises an electrical connector. The electrical connector comprises a flexible printed circuit comprising electrical elements on a flexible substrate. The electrical elements each comprises a solder pad and a contact pad connected by a link. The electrical connector also comprises a base to at least partially surround the flexible printed circuit. The base comprises a connection interface to facilitate electrical connection with the flexible printed circuit through the base. The electrical connector further comprises a receptacle to couple to the base to partially enclose the flexible printed circuit. The receptacle exposes a portion of the flexible printed circuit to facilitate electrical connection with the flexible circuit through the receptacle. The electrical connector system also comprises a complementary electrical connector. The complementary electrical connector comprises a housing and electrical contacts spaced apart from one another around an interior of the housing. Each one of the electrical contacts is positioned to make contact with a corresponding one of the electrical elements of the flexible printed circuit within the electrical connector. The preceding subject matter of this paragraph characterizes example 14 of the present disclosure.

The flexible printed circuit of the electrical connector forms an annulus. The base of the electrical connector has a circular shape. The receptacle of the electrical connector has a circular shape. The housing of the complementary electrical connector has a circular shape. When the complementary electrical connector is selectively coupled to the electrical connector, the base, the receptacle, and the housing are coaxial with the flexible printed circuit along a central axis of the electrical connector system. The preceding subject matter of this paragraph characterizes example 15 of the present disclosure, wherein example 15 also includes the subject matter according to example 14, above.

The receptacle of the electrical connector comprises a first alignment feature. The housing of the complementary electrical connector comprises a second alignment feature. The first alignment feature is engageable with the second alignment feature to promote alignment between the electrical connector and the complementary electrical connector. The first alignment feature and the second alignment feature are radially offset from the central axis of the electrical connector system. The preceding subject matter of this paragraph characterizes example 16 of the present disclosure, wherein example 16 also includes the subject matter according to example 15, above.

The receptacle of the electrical connector comprises a third alignment feature. The housing of the complementary electrical connector comprises a fourth alignment feature. The third alignment feature is engageable with the fourth alignment feature to promote alignment between the electrical connector and the complementary electrical connector. The third alignment feature and the fourth alignment feature are radially offset from the central axis of the electrical connector system. The third alignment feature has a different shape than the first alignment feature. The fourth alignment feature has a different shape than the second alignment feature. The preceding subject matter of this paragraph characterizes example 17 of the present disclosure, wherein example 17 also includes the subject matter according to example 16, above.

The electrical connector further comprises a plurality of first pin contacts in the receptacle. The plurality of first pin contacts is positioned radially inwardly of the flexible printed circuit and extends at least partially through the flexible printed circuit. The complementary electrical connector further comprises a plurality of second pin contacts in the housing. Each one of the plurality of second pin contacts physically engages a corresponding one of the plurality of first pin contacts when the complementary electrical connector is selectively coupled to the electrical connector. The preceding subject matter of this paragraph characterizes example 18 of the present disclosure, wherein example 18 also includes the subject matter according to any one of examples 15-16, above.

The electrical elements of the flexible printed circuit are arranged in a first circular pattern. The electrical contacts of the complementary electrical connector are arranged in a second circular pattern. The preceding subject matter of this paragraph characterizes example 19 of the present disclosure, wherein example 19 also includes the subject matter according to any one of examples 14-18, above.

The electrical contacts of the complementary electrical connector are resiliently flexible. Each one of the electrical contacts of the complementary electrical connector resiliently flex to make contact with the corresponding one of the electrical elements of the flexible printed circuit. The preceding subject matter of this paragraph characterizes example 20 of the present disclosure, wherein example 20 also includes the subject matter according to example 19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
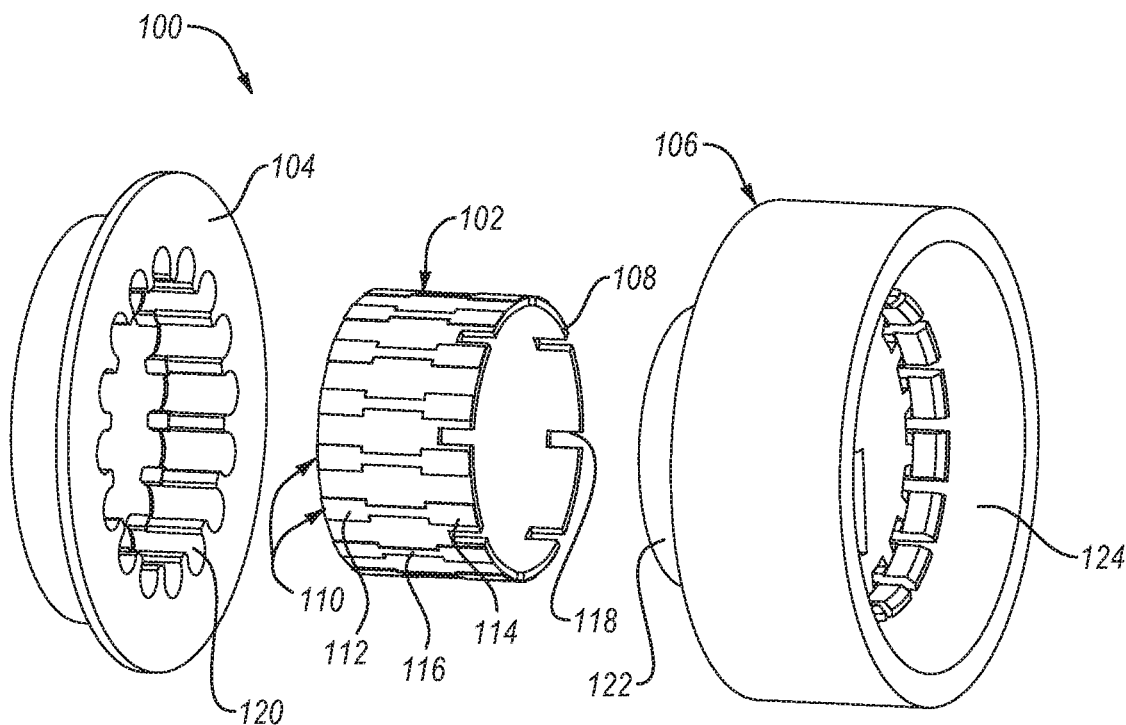
FIG. 1 illustrates an exploded view of a flexible printed circuit electrical connector, according to one or more examples of the present disclosure.

Referring to FIG. 1, an electrical connector 100 which includes a flexible printed circuit (FPC) 102, a base 104, and a receptacle 106 is shown. The electrical connector 100 is considered a high-density electrical connector because the electrical connector 100 has a high density of electrical elements each configured to transmit electrical signals which may be power or communication signals.

The base 104 couples to the receptacle 106 to enclose the FPC 102 within the electrical connector 100. In the illustrated arrangement, the FPC 102 surrounds a portion of the receptacle 106 and the FPC 102 is surrounded partially by the receptacle 106 and partially by the base 104. In the illustrated embodiment, a single FPC 102 is shown. Alternatively, more than one FPC 102 may be incorporated in a nested, side-by-side, layered, or similar arrangement.

The FPC 102 includes a substrate 108 and one or more electrical elements 110. The substrate 108 is a flexible substrate. The substrate 108 may be flexible until installed or shaped for installation. The substrate 108 may also remain flexible after it is shaped and installed. The flexibility of the substrate 108 may be reduced through curing, coating, or forming the substrate 108 into the installed arrangement. In some embodiments, the substrate 108 may include a more flexible portion and a less flexible portion to facilitate assembly of the electrical connector 100 or installation of the FPC 102 in the electrical connector 100. In the illustrated embodiment, the FPC 102 forms a circle or cylinder. In other embodiments, described in more detail below, the FPC 102 may be shaped into other forms or geometries.

The electrical elements 110 may be spaced radially around the substrate 108. The spacing of the electrical elements 110 may be uniform or non-uniform. For example, the electrical elements 110 may include some electrical elements 110 that are closer together and some electrical elements 110 that are further apart relative to one another. One or more of the electrical elements 110 may be printed onto the substrate 108. For example, the electrical elements 110 may be applied via a photolithographic printing process, masking and etching, deposition, or the like.

In some embodiments, printing the FPC 102 reduces expense and complexity involved in forming the FPC 102. Additionally, stamping the FPC 102 from large sheets may further reduce cost, waste, tool wear, and time. Additionally, the electrical elements 110 may provide electrical contact points for a frequent connect/disconnect arrangement in which electrical connections are established and broken as needed. In other words, the position and structure of the FPC 102 may allow for selective electrical connection at one or more of the electrical elements 110 of the FPC 102. This provides significant advantage for high-density electrical connectors by reducing costs and improving connection density in a reduced connector size.

Each electrical element 110 of the FPC 102 includes a solder pad 112 formed on, or applied to, the substrate 108 and connected to a contact pad 114 via a link 116. The contact pad 114 and link 116 are also formed on, or applied to, the substrate 108. In the illustrated embodiment, the solder pad 112 is positioned along one edge of the substrate 108 of the FPC 102 with the contact pad 114 positioned along another edge of the substrate 108 opposite the solder pad 112 with the link 116 extending between the solder pad 112 and the contact pad 114. The solder pad 112 and the contact pad 114 may be similar in geometry or may be distinct from one another. For example, the solder pad 112 and the contact pad 114 may have different thicknesses, widths, lengths, or the like. The alignment of the solder pad 112, the contact pad 114 and the corresponding link 116 is shown as linear but may also be offset from one another. Additionally, more than one solder pad 112 or contact pad 114 may be coupled to more than one corresponding contact pad 114 or solder pad 112. The material of the solder pad 112, the contact pad 114, and the link 116 may be uniform. Alternatively, one or more of the solder pad 112, the contact pad 114, and the link 116 may include one or more materials different from a material of another of the solder pad 112, the contact pad 114, and the link 116.

The position of the electrical element 110, or one or more of the solder pad 112, the contact pad 114, and the link 116 of the electrical element 110, may correspond with a feature of the substrate 108. As shown, the substrate 108 may include notches 118 or other structural features. The substrate 108 may also include a surface feature. For example, a portion of the substrate 108 may include a texture or other feature to interface with one or more of the base 104 and the receptacle 106.

The base 104 is configured to receive at least a portion of the FPC 102 and couple to the receptacle 106. The base 104 may be removably or permanently coupled to the receptacle 106. For example, the base 104 may be coupled to the receptacle 106 via adhesive, bonding, staking, threads, twist lock, friction lock, pins, screws, or other coupling hardware, magnetics, or the like.

The base 104 may be cylindrical, angular, or have another geometry or combination of geometries. The base 104 may be constructed of an electrically non-conductive material. Alternatively, some or all of the base 104 may have an electrically insulating material applied. The base 104 may include thermally conductive materials or other features to manage a thermal characteristic of the electrical connector 100. For example, the base 104 or other component of the electrical connector 100 may include cooling fins.

The base 104 may include a connection interface 120. In the illustrated embodiment, the connection interface 120 is formed on an interior portion of the base 104. Alternatively, the connection interface 120 may be formed on an exterior portion of the base 104. The embodiment of the connection interface 120 shown in FIG. 1 has a scalloped geometry shaped to correspond with a radial spacing of each of the electrical elements 110 of the FPC 102. Alternatively, a single opening or other geometry may be incorporated to allow connections to be established at the electrical element 110.

The receptacle 106 receives at least a portion of the FPC 102 and couples to the base 104. The receptacle 106 may be coaxial with one or both of the FPC 102 and the base 104. Alternatively, one or more of the FPC 102, the base 104, and the receptacle 106, may nonconcentric. In the illustrated embodiment, the receptacle 106 includes a protrusion 122. The protrusion 122 may be shaped to match an internal diameter of the FPC 102. The protrusion 122 may be a solid cylinder or may have hollowed portions for example in a skeletonized arrangement. In this manner, the protrusion 122 may contact corresponding portions of the FPC 102 to support the FPC 102. The protrusion 122 may be monolithically formed on the receptacle 106 or may be coupled to the receptacle 106 separately.

The receptacle 106 includes a receiver interface 124. The receiver interface 124 is shaped to receive a complementary electrical connector such as that shown in FIG. 2. The receiver interface 124 is a recessed structure forming at least a partially enclosure. The receiver interface 124 may include passthrough structures or other features which facilitate electrical communication with the FPC 102 through the receptacle or may include integrated electrical components which engage the electrical elements 110 of the FPC 102 and provide an electrical communication within the receptacle. The receiver interface 124 of the receptacle 106 may also include an alignment feature to align a complementary connector, for example, with the electrical elements 110 of the FPC 102. Additionally, the receiver interface 124 may include security features which allow the receptacle 106 to engage and retain a complementary electrical connector. For example, the receiver interface 124 may include a thread, twist lock, friction lock, tab, groove, latch, pin, spring, or the like. Additionally, one or both of the base 104 and the receptacle 106 may include shielding to reduce electromagnetic interference. In the illustrated embodiment, the electrical connector 100 is a female connector shaped to receive a male complementary connector. Alternatively, the electrical connector 100 may be configured as a male connector to be inserted into a female complementary connector.

Figure 2:
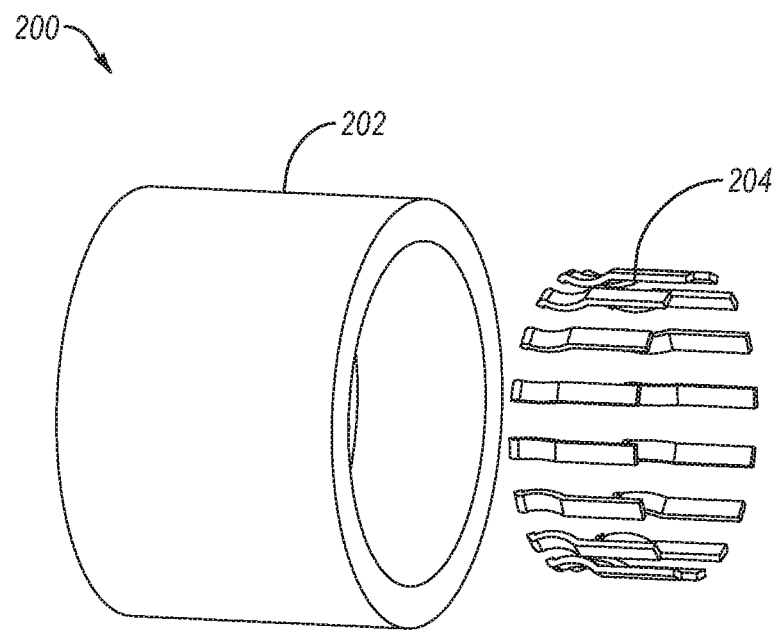
FIG. 2 illustrates an exploded view of a complement electrical connector, according to one or more examples of the present disclosure.

Referring now to FIG. 2, the complementary electrical connector 200 is shown. The complementary electrical connector 200 includes a housing 202 and electrical contacts 204. The housing 202 is configured to support and position the electrical contacts 204 within the housing 202. The spacing of the electrical contacts 204 may correspond with the spacing of the electrical elements 110 of the FPC 102 of the electrical connector 100. As shown, the electrical contacts 204 may be arranged radially around an interior of the housing 202. The electrical contacts 204 may be stamped or machined contacts that are resiliently flexible. The electrical contacts 204 may provide a contact force between the electrical contacts 204 and the electrical elements 110 of the FPC 102. Additionally, the electrical contacts 204 may provide a retention force to resist separation of the complementary electrical connector 200 relative to the electrical connector 100 of FIG. 1. Alternatively, the housing 202 may be configured to reduce a loading of the electrical contacts 204 on the FPC 102.

The housing 202 may be electrically insulating to prevent shorts between the electrical contacts 204. Furthermore, shielding may be incorporated into the housing 202 to reduce electromagnetic interference. Additionally, the housing 202 may include an alignment feature (see FIG. 3) that corresponds with an alignment feature of the electrical connector 100. The housing 202 may also include a security feature configured to engage a corresponding security feature of the receptacle 106 to resist unintentional separation of the two. The housing 202 may also include a surface texture applied to the housing 202 to improve grip, facilitate thermal exchange, or provide other characteristics or functionality of the complementary electrical connector 200. While the housing 202 is shown as cylindrical, the housing 202 may be cuboidal, rectangular, polygonal, or the like. Furthermore, the housing 202 may have a consistent cross-sectional diameter or may vary along the length of the housing 202.

Figure 3:
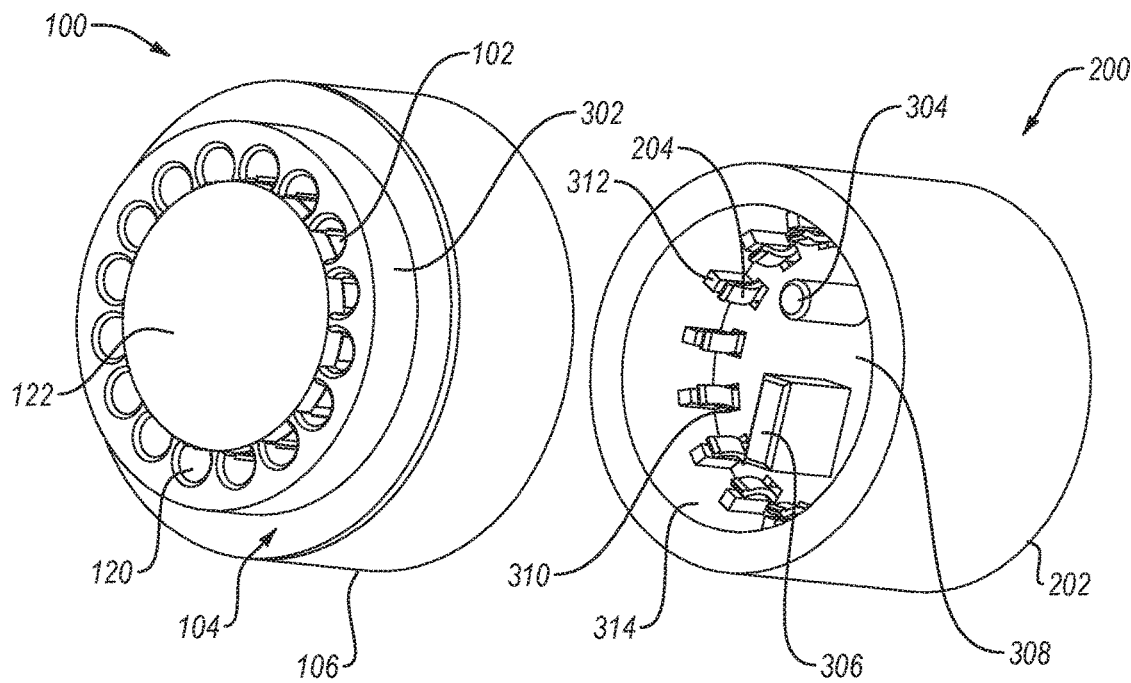
FIG. 3 illustrates a first perspective view of the flexible printed circuit electrical connector of FIG. 1 with the complement electrical connector of FIG. 2, according to one or more examples of the present disclosure.

Referring now to FIG. 3, the electrical connector 100 is shown relative to the complementary electrical connector 200. The electrical connector 100 is oriented to receive the complementary electrical connector 200. The electrical connector 100 is assembled with the FPC 102 accessible to the electrical contacts 204 through the connection interface 120 in the base 104, the protrusion 122 aligning flush with the surface of the base 104 at the connection interface 120 to form an individual access for each connection interface 120.

The base 104 includes an annular surface 302 having a reduced diameter cylindrical geometry. The annular surface 302 may provide a mounting location for a cable or cable sheath to couple to the electrical connector 100. For example, the annular surface 302 may include threads, elevated regions, depressions, or the like to secure a cable, conduit, or other structure to the base 104.

The complementary electrical connector 200 includes a first alignment feature 304 and a second alignment feature 306 disposed on a connection face 308 of the complementary electrical connector 200. The connection face 308 forms a circular planar surface concentric with the housing 202 and recessed into the housing 202 forming a hollow space or cavity in the housing 202. The electrical contacts 204 extend through apertures 310 formed around a perimeter of the connection face 308.

The first alignment feature 304 extends out from the connection face 308 in a direction axially parallel to the housing. The first alignment feature 304 is cylindrical and is axially offset from the housing 202. The second alignment feature 306 also extends out from the connection face 308 in the same direction as the first alignment feature 304. The second alignment feature 306 varies in geometry from the first alignment feature 304 to avoid a misaligned connection between the electrical connector 100 and the complementary electrical connector 200. As shown, the second alignment feature 304 is a rectangular prism. The size, position, and shape of the first alignment feature 304 and the second alignment feature 306 may vary. In some embodiments, one of more of the first alignment feature 304 and the second alignment feature 306 may include a chamfer or draft angle to facilitate mating of the complementary electrical connector 200 with the electrical connector 100. While two alignment features are shown, fewer or more alignment features may be used.

The illustrated embodiment also includes support structures 312 formed on an interior annular surface 314 of the housing 202. The interior annular surface 314 is defined by the distance at which the connection face 308 is recessed into the housing 202. The support structures 312 extend radially inward from the interior annular surface 314 and correspond to the electrical contacts 204. The support structures 312 may provide mechanical support to the electrical contacts 204 and may further provide additional alignment of the complementary electrical connector 200 relative to the electrical connector 100.

Figure 4:
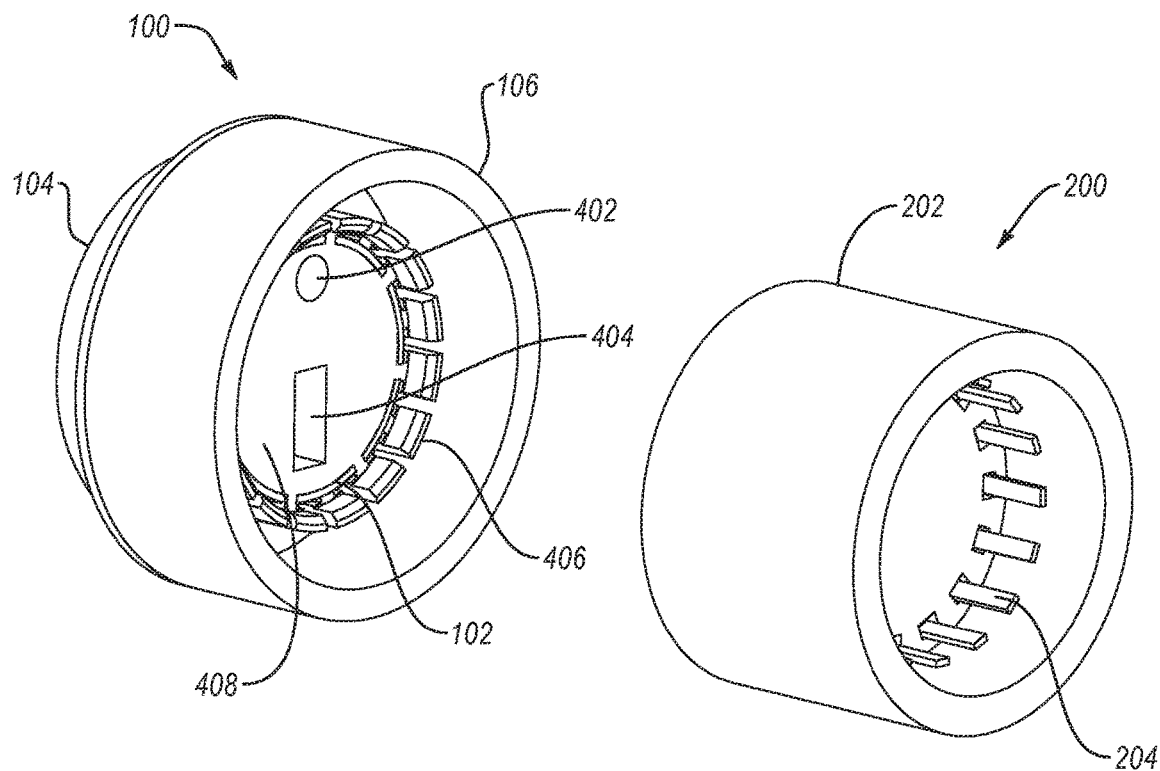
FIG. 4 illustrates a second perspective view of the flexible printed circuit electrical connector of FIG. 1 with the complement electrical connector of FIG. 2, according to one or more examples of the present disclosure.

Referring to FIG. 4, the electrical connector 100 may include a first alignment feature receiver 402 and a second alignment feature receiver 404. The first alignment feature receiver 402 may be a recess formed in the receptacle 106 and shaped to receive the first alignment feature 304. Similarly, the second alignment feature receiver 404 may be recessed in the receptacle 106 and shaped to receive the second alignment feature 306 formed in the complementary electrical connector 200.

The electrical connector 100 also includes one or more retention structures 406 disposed about an internal periphery of the receptacle 106. The number, spacing, size, and shape of each retention structure 406 may correspond with the associated electrical contacts 204 within the complementary electrical connector 200. In the illustrated embodiment, the retention structures 406 have a T-shaped geometry radiating outward from a center projection 408 of the receptacle 106. Every other retention structure 406 is separated from the center projection 408 by the FPC 102 while the other retention structure 406 correspond to, and align with, the notches 118 of the FPC 102 as shown in FIG. 1. One or more of the electrical connector 100 and the complementary electrical connector 200 may include a gasket, O-ring, seal, or the like to form at least a partially sealed connection between the electrical connector 100 and the complementary electrical connector 200. The connection may be water-resistant, particulate-resistant, vibration-damping, corrosion-resistant, or the like.

Figure 5:
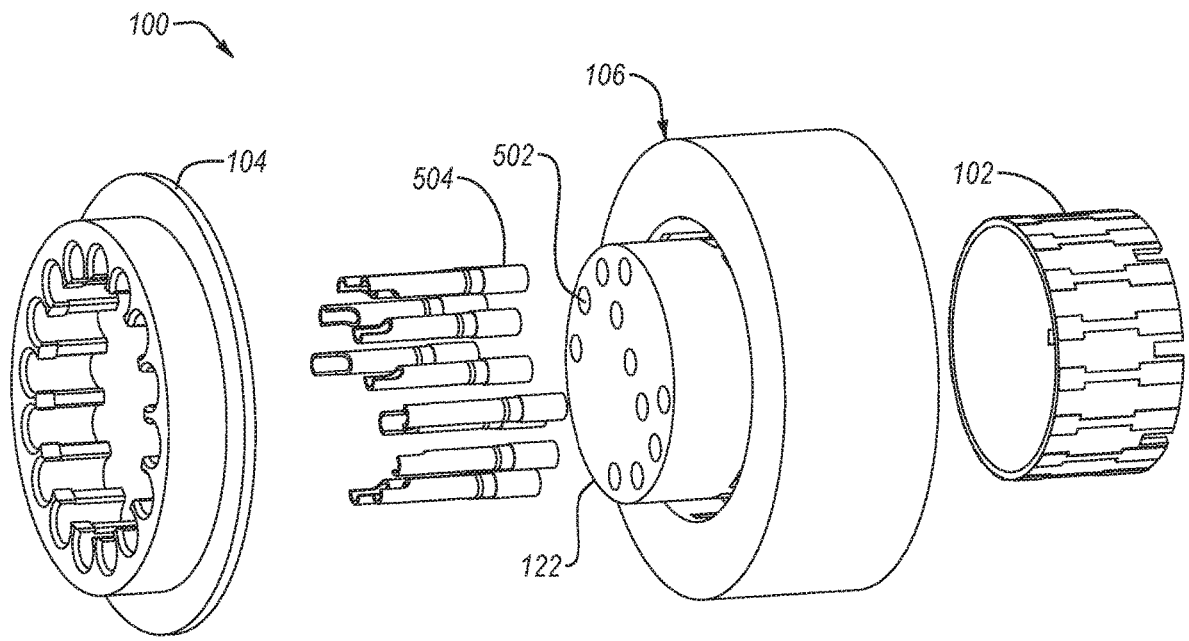
FIG. 5 illustrates an exploded view of a pinned variant of a flexible printed circuit electrical connector, according to one or more examples of the present disclosure.

Referring to FIG. 5, the electrical connector 100 may include a receptacle 106 which has one or more pin apertures 502 formed in the protrusion 122 to receive first pin contacts 504. The pin apertures 502 may be arranged in a pattern on the protrusion 122 to provide connection with a particular connector, power, or signal type. The first pin contacts 504 may provide an electrical connection separate from the FPC 102 or one or more of the first pin contacts 504 may be in electrical communication with a portion of the FPC 102. While the first pin contacts 504 are shown as open at both ends to receive a corresponding pin or other connector, one or more of the first pin contacts 504 may also be closed, solid, or narrowed at one or both ends. The first pin contacts 504 may be removably or non-removably fixed in the receptacle 106. For example, the first pin contacts 504 may be removable to facilitate reconfiguration to a particular format or arrangement for a particular connection or transmission type. While pin contacts are shown, other connections may also or alternatively be incorporated, such as pneumatic connections, fluidic connections, optical connections, or the like.

Figure 6:
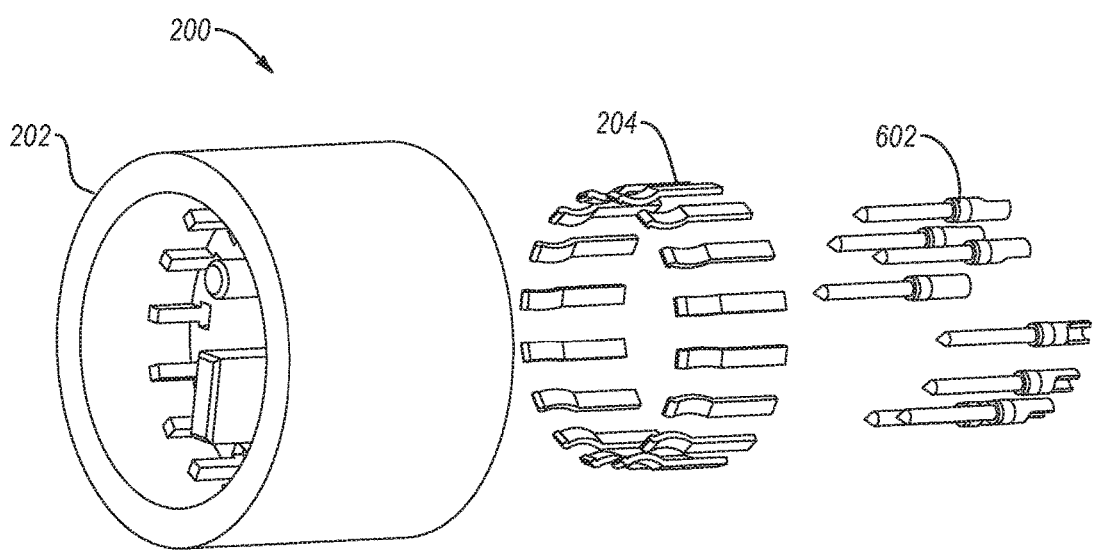
FIG. 6 illustrates an exploded view of a pinned variant of a complement electrical connector, according to one or more examples of the present disclosure.
Figure 7:
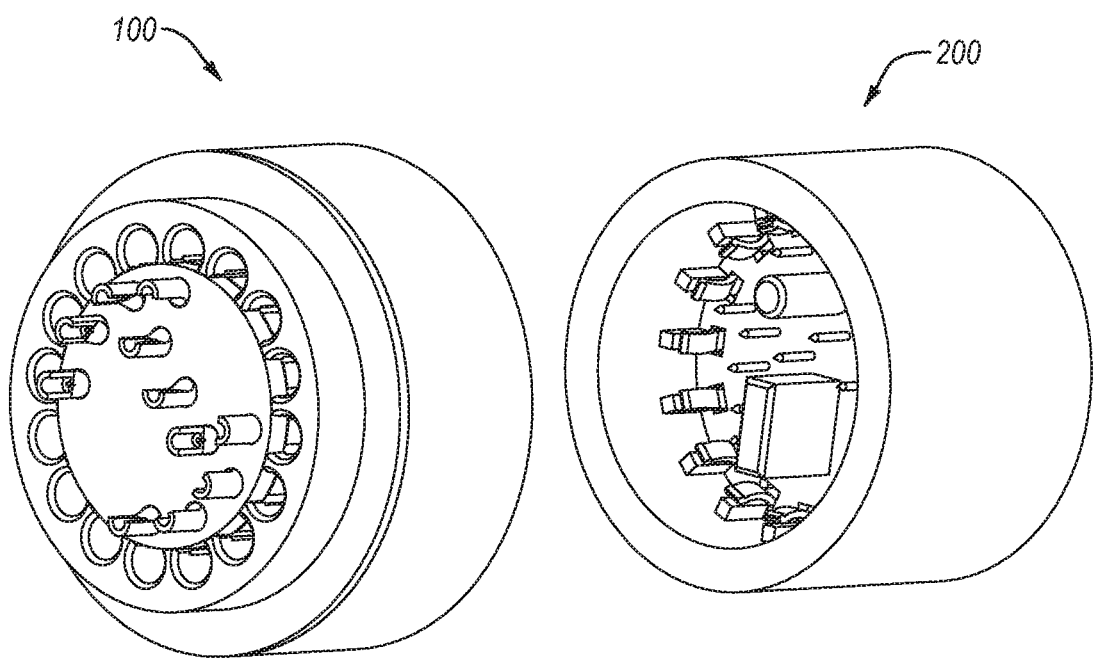
FIG. 7 illustrates a first perspective view of the pinned variant of the flexible printed circuit electrical connector of FIG. 5 with the pinned variant of the complement electrical connector of FIG. 6, according to one or more examples of the present disclosure.

Referring to FIG. 6, the complementary electrical connector 200 is shown with one or more optional second pin contacts 602. The second pin contacts 602 may be removably or permanently disposed in the housing 202. One or more of the second pin contacts 602 may be in electrical communication with one or more of the electrical contacts 204. Alternatively, the second pin contacts 602 may be electrically isolated from the electrical contacts 204. The second pin contacts 602 may have one or more male ends or one or more female ends. FIG. 7 illustrates the electrical connector 100 of FIG. 5 aligned to receive the complementary electrical connector 200 of FIG. 6.

Figure 8:
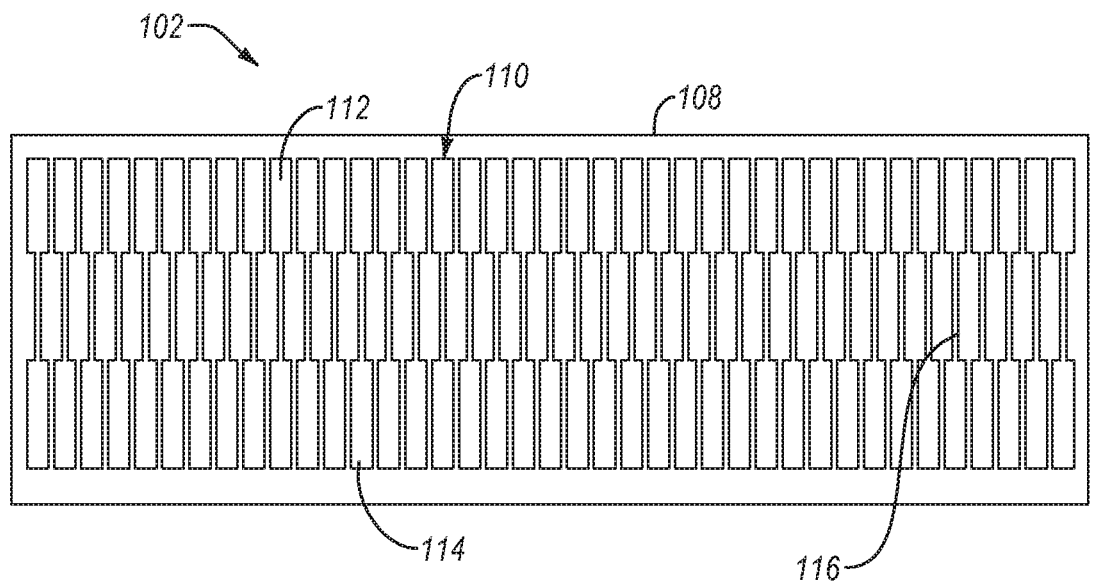
FIG. 8 illustrates a planar view of a flexible printed circuit for an electrical connector, according to one or more examples of the present disclosure.

Referring to FIG. 8, the FPC 102 is shown in a planar arrangement. The FPC 102 may be manufactured in the planar arrangement and then formed into a final shape or arrangement. The electrical elements 110 may be evenly spaced, as shown, or they may be offset from one another at different distances. The electrical elements 110 may be arranged on the substrate in a parallel or non-parallel arrangement. One or more of the solder pads 112 may be electrically linked to one or more of the contact pads 114 by one or more links 116. Each of the solder pads 112 and the contact pads 114 may be rectangular, round, or have any other shape. The shape of the components of the electrical elements 110 may be uniform across the FPC 102 or one or more of the electrical elements 1120 may differ from another.

Figure 9:
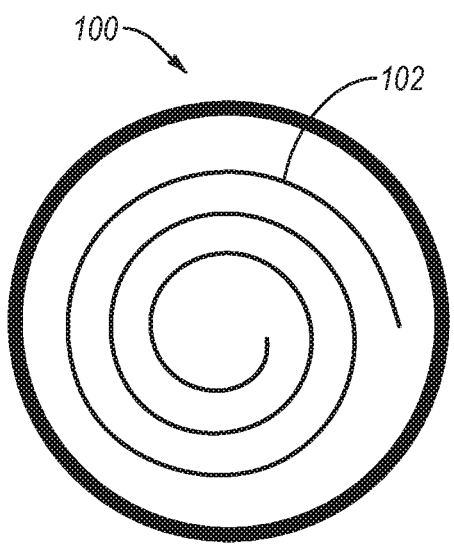
FIG. 9 illustrates a cross-sectional perspective view of a spiral arrangement of a flexible printed circuit in an electrical connector, according to one or more examples of the present disclosure.

Referring to FIG. 9, the FPC 102 may be formed into a spiral or helical arrangement. The FPC 102 may be positioned in an "end-card" manner exposing the contact pads 114 of the FPC for connection along a corresponding edge of the FPC 102. The FPC 102 may be formed into the spiral arrangement via a treatment process prior to installation or via physical installation into the electrical connector 100. The spiral arrangement may be maintained by corresponding hardware such as a spiral channel or holder (not shown) included in the electrical connector 100 or by one or more spacers (not shown) formed on or coupled to the FPC 102. The FPC 102 may be positioned to maintain a constant separation from itself throughout the spiral or may have a variable separation distance.

Figure 10:
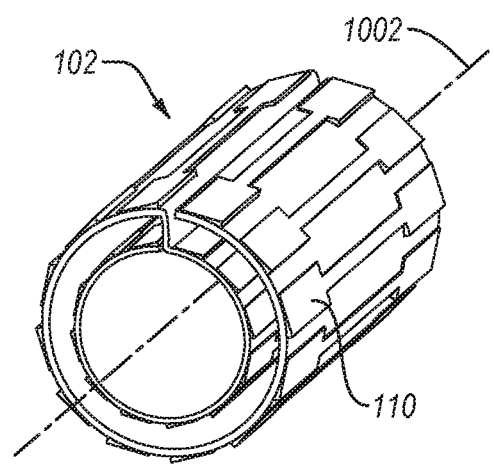
FIG. 10 illustrates a perspective view of a stepped spiral arrangement of a flexible printed circuit, according to one or more examples of the present disclosure.

Referring to FIG. 10, the FPC 102 may also have a stepped concentric arrangement. The FPC 102 may form portions or layers which are concentric about a central axis 1002. The FPC 102 may be arranged in two layers, as shown, or in more than two layers. The ends of the FPC 102 may be left free or may be bonded or otherwise coupled to a corresponding portion of the FPC 102 or another structure. The FPC 102 may be flared or tapered along the central axis 1002 of the FPC 102. The FPC 102 may have electrical elements 110 positioned along the FPC 102 to facilitate the particular arrangement of the FPC 102. For example, the electrical elements 110 may be omitted from the FPC 102 in the areas at which the FPC 102 is folded, bent, or otherwise changes direction or geometry.

Figure 11:
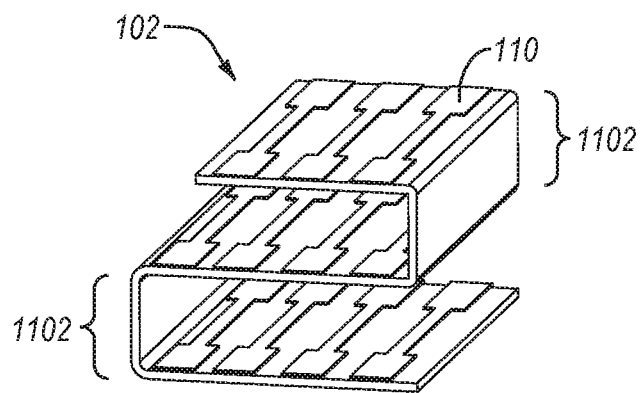
FIG. 11 illustrates a perspective view of a switchback arrangement of a flexible printed circuit, according to one or more examples of the present disclosure.

Referring to FIG. 11, the FPC 102 is formed into a switchback arrangement. In the illustrated embodiment, the FPC 102 includes two switchbacks or 180° turns forming three layers with electrical elements 110 disposed thereon. The layers may be parallel or non-parallel, planar or non-planar. The switchback arrangement of the FPC 102 may include vertical portions 1102, as shown, or may omit the vertical portions for simple folds, bends, or curves. The electrical elements 110 may be included or omitted from the vertical portions 1102. Additionally, the electrical elements 110 may be disposed on one or both sides of the FPC 102. The electrical elements 110 may also be disposed on one side of the FPC 102 to correspond with the orientation of the different layers of the FPC 102 in the switchback arrangement. For example, the electrical elements 110 may be disposed on different sides such that the electrical elements 110 all face the same direction once the FPC 102 is formed into the switchback arrangement, as shown.

Figure 12:
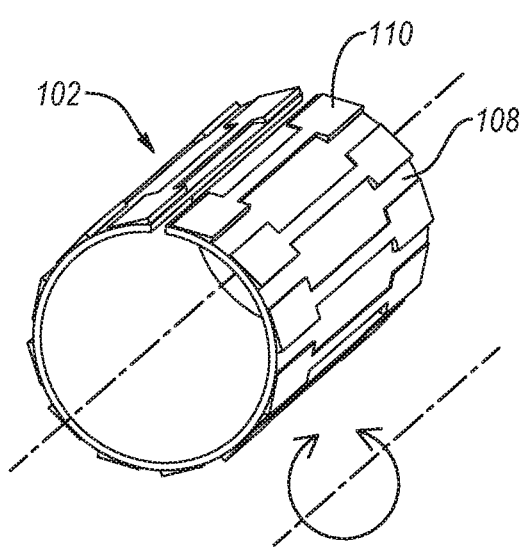
FIG. 12 illustrates a perspective view of a single-sided flexible printed circuit in a cylindrical arrangement, according to one or more examples of the present disclosure.
Figure 13:
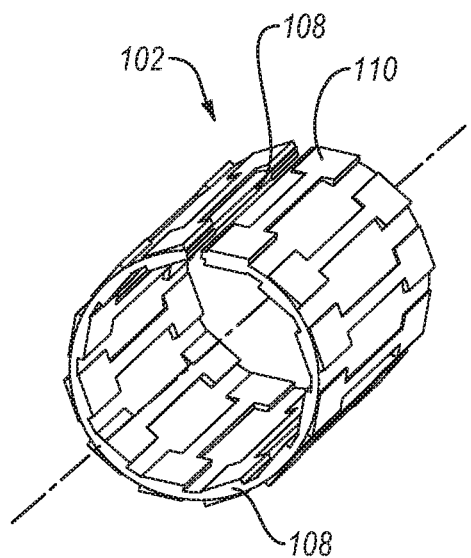
FIG. 13 illustrates a perspective view of a two-sided flexible printed circuit in a cylindrical arrangement, according to one or more examples of the present disclosure.

Referring to FIG. 12, the FPC 102 may form a cylinder with electrical elements 110 disposed on a single side of the FPC 102. The electrical elements 110 may be disposed on the substrate to be on an inside surface or an outside surface of the cylindrical arrangement, as shown. Alternatively, the electrical elements 110 may be formed on both sides of the FPC 102 to be on both an inside and an outside of the cylindrical arrangement, as shown in FIG. 13. The thickness of the substrate 108 may be adjusted to affect a flexibility of the FPC 102, provide a corresponding edge resiliency, to provide separation for electrical elements 110 disposed on both sides of the FPC 102, or the like. The substrate 108 may include one or more conductive vias passing through a thickness of the FPC 102 or other electronic elements in communication with, or independent of, the electrical elements 110.

Figure 14:
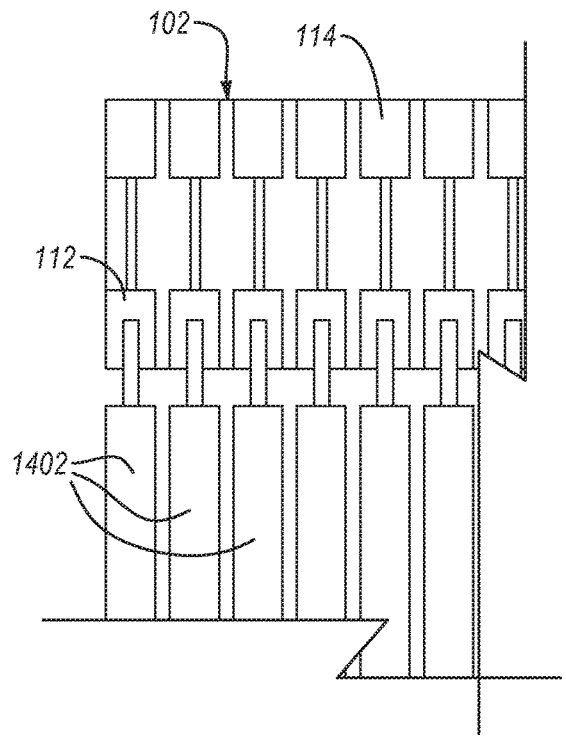
FIG. 14 illustrates an elevation view of the flexible printed circuit with electrical leads attached, according to one or more examples of the present disclosure.
Figure 15:
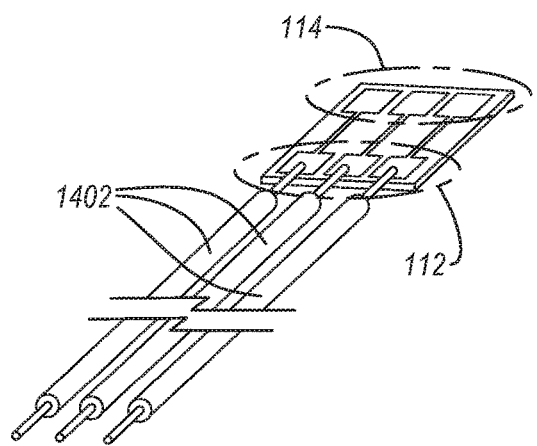
FIG. 15 illustrates a perspective view of the flexible printed circuit and electrical leads of FIG. 14, according to one or more examples of the present disclosure.

Referring to FIGS. 14 and 15, one or more electrical leads 1402 are coupled to the FPC 102 at the solder pads 112. The electrical leads 1402 may be individual conductors or may be portions of a larger component. For example, the electrical leads 1402 may be individual leads or may form a ribbon cable or other composite conductor in which two or more of the electrical leads 1402 are grouped together. The solder pads 112 may be configured to facilitate application of a solder or another binding material or may have solder or another binding material pre-applied to facilitate reception and coupling of the electrical leads 1402. For example, one or more of the solder pads 112 may be configured to receive the electrical leads and then receive a binding material or the solder pads 112 may be preloaded with a binding material in preparation to receive the electrical leads 1402. The binding or electrical coupling of the electrical leads 1402 to the solder pads 112 may be automated or performed manually. The solder pads 112 may include plated through holes to receive electrical leads 1402.

Figure 16:
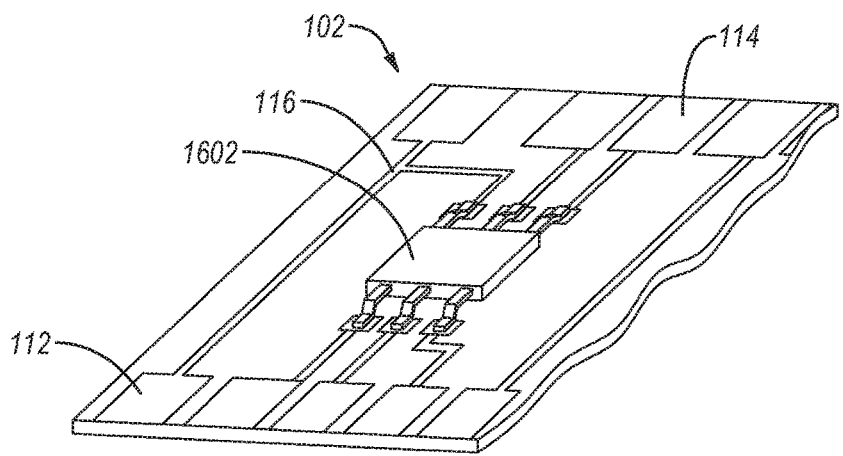
FIG. 16 illustrates a perspective view of a flexible printed circuit with an integrated electrical component.

Referring to FIG. 16, the FPC 102 may include an electronic component 1602 disposed on the FPC 102 to be in communication with one or more solder pads 112 and contact pads 114 either directly or by way of one or more of the links 116. The electronic component 1602 may be a leaded component coupled to the FPC 102 by surface mounting or other coupling processes. The electronic component 1602 may be coupled to the FPC 102 prior to other operations or may be coupled to the FPC 102 after completion of the FPC 102. The FPC 102 may be configured to include multiple electronic components 1602.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An electrical connector, comprising:
a flexible printed circuit comprising electrical elements on a flexible substrate, the electrical elements each comprising a solder pad and contact pad connected by a link;
a base to at least partially surround the flexible printed circuit, the base comprising a connection interface to facilitate electrical connection with the flexible printed circuit through the base; and
a receptacle to couple to the base to partially enclose the flexible printed circuit, the receptacle exposing a portion of the flexible printed circuit to facilitate selective electrical connection with the flexible printed circuit through the receptacle;
wherein the flexible printed circuit forms an annulus.

2. The electrical connector according to claim 1, wherein:
the flexible substrate of the flexible printed circuit comprises a radially outer peripheral surface and a radially inner peripheral surface, the radially inner peripheral surface being opposite the radially outer peripheral surface; and
the electrical elements are on the radially outer peripheral surface of the flexible substrate.

3. The electrical connector according to claim 1, wherein:
the base has a circular shape;
the receptacle has a circular shape; and
the base and the receptacle are coaxial with the flexible printed circuit.

4. The electrical connector according to claim 1, wherein:
the receptacle comprises a circular protrusion coaxial with the base, the receptacle, and the flexible printed circuit; and
the flexible printed circuit is supported on the circular protrusion.

5. The electrical connector according to claim 4, wherein:
the base forms an annulus; and
the circular protrusion of the receptacle extends at least partially through the base.

6. The electrical connector according to claim 5, wherein:
a radially inner edge of the base comprises a plurality of recesses;
the flexible printed circuit supported on the circular protrusion circumferentially encloses the plurality of recesses to form a plurality of apertures; and
each one of the electrical elements is at least partially positioned within a corresponding one of the plurality of apertures.

7. The electrical connector according to claim 1, further comprising at least one pin contact in the receptacle, wherein the at least one pin contact is positioned radially inwardly of the flexible printed circuit and extends at least partially through the flexible printed circuit.

8. The electrical connector according to claim 1, wherein:
the flexible substrate comprises a surface extending between a first edge and a second edge of the flexible substrate;
the solder pad is positioned on the surface along the first edge;
the contact pad is positioned on the surface along the second edge; and
the link is positioned on the surface and extends between the solder pad and the contact pad.

9. The electrical connector according to claim 1, wherein:
the flexible substrate comprises a first surface and a second surface, the second surface being opposite the first surface;
a first set of the electrical elements are on the first surface of the flexible substrate; and
a second set of the electrical elements are on the second surface of the flexible substrate.

10. An electrical connector, comprising:
a flexible printed circuit comprising electrical elements on a flexible substrate, the electrical elements each comprising a solder pad and contact pad connected by a link;
a base to at least partially surround the flexible printed circuit, the base comprising a connection interface to facilitate electrical connection with the flexible printed circuit through the base; and
a receptacle to couple to the base to partially enclose the flexible printed circuit, the receptacle exposing a portion of the flexible printed circuit to facilitate selective electrical connection with the flexible printed circuit through the receptacle;
wherein the flexible printed circuit forms a spiral.

11. An electrical connector, comprising:
a flexible printed circuit comprising electrical elements on a flexible substrate, the electrical elements each comprising a solder pad and contact pad connected by a link;
a base to at least partially surround the flexible printed circuit, the base comprising a connection interface to facilitate electrical connection with the flexible printed circuit through the base; and
a receptacle to couple to the base to partially enclose the flexible printed circuit, the receptacle exposing a portion of the flexible printed circuit to facilitate selective electrical connection with the flexible printed circuit through the receptacle;
wherein the flexible printed circuit comprises multiple spaced apart and concentric layers.

12. The electrical connector according to claim 11, wherein the multiple spaced apart and concentric layers are separated by a gap and formed from a single, continuous length of the flexible printed circuit.

13. An electrical connector, comprising:
a flexible printed circuit comprising electrical elements on a flexible substrate, the electrical elements each comprising a solder pad and contact pad connected by a link;
a base to at least partially surround the flexible printed circuit, the base comprising a connection interface to facilitate electrical connection with the flexible printed circuit through the base; and
a receptacle to couple to the base to partially enclose the flexible printed circuit, the receptacle exposing a portion of the flexible printed circuit to facilitate selective electrical connection with the flexible printed circuit through the receptacle;
wherein the flexible printed circuit is in a switchback arrangement comprising at least two spaced apart portions of the flexible printed circuit, separated by a gap, parallel to each other, and intercoupled together by a folded portion of the flexible printed circuit.

14. The electrical connector according to claim 13, wherein the at least two spaced part portions and the folded portion of the flexible printed circuit are formed from a single, continuous length of the flexible printed circuit.

15. An electrical connector system, comprising:
an electrical connector comprising:
  a flexible printed circuit comprising electrical elements on a flexible substrate, the electrical elements each comprising a solder pad and contact pad connected by a link;
  a base to at least partially surround the flexible printed circuit, the base comprising a connection interface to facilitate electrical connection with the flexible printed circuit through the base; and
  a receptacle to couple to the base to partially enclose the flexible printed circuit, the receptacle exposing a portion of the flexible printed circuit to facilitate electrical connection with the flexible circuit through the receptacle; and
a complementary electrical connector selectively couplable to the electrical connector, the complementary electrical connector comprising:
  a housing; and
  electrical contacts spaced apart from one another around an interior of the housing, each one of the electrical contacts positioned to make contact with a corresponding one of the electrical elements of the flexible printed circuit within the electrical connector;
wherein:
  the electrical elements of the flexible printed circuit are arranged in a first circular pattern; and
  the electrical contacts of the complementary electrical connector are arranged in a second circular pattern.

16. The electrical connector system according to claim 15, wherein:
the flexible printed circuit of the electrical connector forms an annulus;
the base of the electrical connector has a circular shape;
the receptacle of the electrical connector has a circular shape;
the housing of the complementary electrical connector has a circular shape; and
when the complementary electrical connector is selectively coupled to the electrical connector, the base, the receptacle, and the housing are coaxial with the flexible printed circuit along a central axis of the electrical connector system.

17. The electrical connector system according to claim 16, wherein:
the receptacle of the electrical connector comprises a first alignment feature;
the housing of the complementary electrical connector comprises a second alignment feature;
the first alignment feature is engageable with the second alignment feature to promote alignment between the electrical connector and the complementary electrical connector; and
the first alignment feature and the second alignment feature are radially offset from the central axis of the electrical connector system.

18. The electrical connector system according to claim 17, wherein:
the receptacle of the electrical connector comprises a third alignment feature;
the housing of the complementary electrical connector comprises a fourth alignment feature;
the third alignment feature is engageable with the fourth alignment feature to promote alignment between the electrical connector and the complementary electrical connector;
the third alignment feature and the fourth alignment feature are radially offset from the central axis of the electrical connector system;
the third alignment feature has a different shape than the first alignment feature; and
the fourth alignment feature has a different shape than the second alignment feature.

19. The electrical connector system according to claim 16, wherein:
the electrical connector further comprises a plurality of first pin contacts in the receptacle;
the plurality of first pin contacts is positioned radially inwardly of the flexible printed circuit and extends at least partially through the flexible printed circuit;
the complementary electrical connector further comprises a plurality of second pin contacts in the housing; and
each one of the plurality of second pin contacts physically engages a corresponding one of the plurality of first pin contacts when the complementary electrical connector is selectively coupled to the electrical connector.

20. The electrical connector system according to claim 15, wherein:
the electrical contacts of the complementary electrical connector are resiliently flexible; and
each one of the electrical contacts of the complementary electrical connector resiliently flex to make contact with the corresponding one of the electrical elements of the flexible printed circuit.

* * * * *